United States Patent [19]

Nambu et al.

[11] Patent Number: 5,448,527
[45] Date of Patent: Sep. 5, 1995

[54] DECODER AND DRIVER FOR USE IN A SEMICONDUCTOR MEMORY

[75] Inventors: Hiroaki Nambu, Sagamihara; Noriyuki Homma, Kodaira; Kazuo Kanetani, Akishima; Youji Idei, Asaka; Kenichi Ohhata; Takesi Kusunoki, both of Tachikawa, all of Japan

[73] Assignees: Hitachi, Ltd., Tokyo; Hitachi Device Engineering Co., Ltd., Chiba, both of Japan

[21] Appl. No.: 149,936

[22] Filed: Nov. 10, 1993

[30] Foreign Application Priority Data

Nov. 27, 1992 [JP] Japan .................................. 4-318161

[51] Int. Cl.[6] .............................................. G11C 8/00
[52] U.S. Cl. ........................... 365/230.06; 365/189.09; 326/105
[58] Field of Search .................. 365/230.06, 189.09; 307/463, 446, 445; 326/105, 106

[56] References Cited

U.S. PATENT DOCUMENTS

| | | | |
|---|---|---|---|
| 4,394,657 | 7/1983 | Isogai | 365/230.06 |
| 5,023,478 | 6/1991 | Boudon | 307/446 |
| 5,034,630 | 7/1991 | Sugiyama | 307/463 |
| 5,252,863 | 10/1993 | Hatsuda | 365/230.06 |

OTHER PUBLICATIONS

The transactions C of the Institute of Electronics, Information and Communication Engineers, of Japan, vol. J70-C, No. 6, pp. 783-790.

*Primary Examiner*—David C. Nelms
*Assistant Examiner*—A. Zarabian
*Attorney, Agent, or Firm*—Antonelli, Terry, Stout & Kraus

[57] ABSTRACT

A decoder formed of multiple circuit blocks each including bipolar transistors Q1 and Q2 having their collectors connected to resistors R1 and R2, respectively, a bipolar transistor Q3 having its collector supplied with a power voltage, and a current source I1 connected commonly to the emitters of Q1-Q3. This circuit configuration permits the decoder and BiCMOS memories using it to operate with a low supply voltage.

13 Claims, 15 Drawing Sheets

DECODER AND DRIVER FOR USE IN A SEMICONDUCTOR MEMORY

BACKGROUND OF THE INVENTION

This invention relates to a decoder, which is suitably designed to operate with a low supply voltage, and to a semiconductor memory using such a decoder.

At present, main-frame computers typically have their high-speed cache memory and control memory formed of a bipolar memory or BiCMOS memory. The bipolar memory and BiCMOS memory have a property of very fast operation, although their power consumption is large to some extent. Due to the recent trend of down-sizing of IC memory devices, their element transistors have a lower breakdown voltage, and therefore it becomes necessary to design such bipolar memories and BiCMOS memories to operate with low supply voltages.

An example of the conventional decoder intended for the high-speed operation of a bipolar memory or BiCMOS memory is described in an article entitled "Fabrication of a large-capacity, high-speed SRAM based on the BiCMOS technology" (in The transactions C of The Institute of Electronics, Information and Communication Engineers of Japan, Vol. J70-C, No.6, pp.783–790, published in June 1987).

This decoder uses series-gate circuits to reduce the number of gates thereby to speed up the operation. However, the use of series-gate circuits makes difficult the circuit design for low supply voltage operation.

FIG. 3 shows a decoder developed by the inventors from conventional decoders during their studies leading to the present invention. The arrangement of FIG. 3 is suitable for a high-speed bipolar memory and BiCMOS memory. The circuit consists of input buffers IB1 and IB2 and a decoder DEC. The following Table 1 is a truth table between the inputs IN1 and IN2 and the outputs OUT1 through OUT4 of the circuit.

TABLE 1

| IN1 | IN2 | OUT1 | OUT2 | OUT3 | OUT4 |
|-----|-----|------|------|------|------|
| L   | L   | L    | H    | H    | H    |
| H   | L   | H    | L    | H    | H    |
| L   | H   | H    | H    | L    | H    |
| H   | H   | H    | H    | H    | L    |

The decoder shown in FIG. 3 has one of the outputs OUT1 through OUT4 becoming a low (L) level in response to a certain combination of the inputs IN1 and IN2, and this kind of decoder will be called "L decoder".

The study of this decoder by the inventors of the present invention revealed that the bipolar transistors Q1 (or Q2) and Q3 in serial connection forms a series-gate circuit, making the circuit design for low supply voltage operation difficult as will be explained in the following discussion.

For the output signal of the decoder having a voltage swing of $V_{OUT}$ volts, the transistor Q1 has a high collector voltage level H of 0 volt and a low voltage level L of $-V_{OUT}$ volts. Generally, a bipolar transistor operating in saturation mode has its operating speed reduced. Therefore in order for the decoder to operate fast, the transistor Q1 must operate in the non-saturation mode. For the non-saturant operation of the Q1, it must have a base voltage that is always lower than the collector voltage, i.e., always lower than $-V_{OUT}$. Accordingly, the transistor Q1 must have an emitter voltage lower than $-V_{OUT}-V_{BE}$ (where $V_{BE}$ is a base-to-emitter voltage of a bipolar transistor).

For the high-speed operation of the whole gate circuit, the transistor Q3 must operate in the non-saturation mode. For the non-saturant operation of the Q3, it must have a base voltage that is always lower than $-V_{OUT}-V_{BE}$. Accordingly, the transistor Q3 must have an emitter voltage lower than $-V_{OUT}-2\times V_{BE}$. With a current source I1 having an operating voltage of V1, the emitter supply voltage $V_{EE}$ must be lower than $-V_{OUT}-2\times V_{BE}-V1$. In other words, the supply voltage in terms of the absolute value $|V_{EE}|$ cannot be smaller than $V_{OUT}+2\times V_{BE}+V1$. On this account, a bipolar memory or BiCMOS memory using this decoder cannot have a supply voltage lower than $V_{OUT}+2\times V_{BE}+V1$.

SUMMARY OF THE INVENTION

An object of this invention is to provide a decoder operating on a low supply voltage.

Another object of this invention is to provide a semiconductor memory device, such as a bipolar memory or BiCMOS memory, having a low supply voltage.

The above objectives are achieved through the following first arrangement of a decoder. Namely, the decoder comprises a plurality of circuit blocks each including a first and second load elements, a current source, a first switch which conducts a current from the current source to the first load element or second load element selectively depending on a first logic signal that is a non-inverted or inverted input signal or is produced by a logical AND or logical OR operation for a plurality of input signals, and a second switch which inhibits the conduction of the current of the current source to the first or second load element regardless of the first logic signal, but depending on a second logic signal that is a non-inverted or inverted input signal or is produced by a logical AND or logical OR operation for a plurality of input signals, with output signals of each circuit block being led out from the node of the first load element and the first switch and from the node of the second load element and the first switch.

Alternatively, the above objectives are achieved through the following second arrangement of a decoder. Namely, the decoder in this second arrangement comprises a plurality of circuit blocks each including a first bipolar transistor having its collector connected to a first load element and its base supplied with a first logic signal that is a non-inverted or inverted input signal or is produced by a logical AND or logical OR operation for a plurality of input signals, a second bipolar transistor having its collector connected to a second load element, its base supplied with a second logic signal that is a non-inverted or inverted input signal or is produced by a logical AND or logical OR operation for a plurality of input signals and its emitter connected to the emitter of the first bipolar transistor, a third bipolar transistor having its collector supplied with a constant voltage, its base supplied with a third logic signal that is a non-inverted or inverted input signal or is produced by a logical AND or logical OR operation for a plurality of input signals and its emitter connected to the emitter of the first bipolar transistor, and a current source connected commonly to the emitters of the first, second and third bipolar transistors, with output signals of each circuit block being led out from the collectors of the first and second bipolar transistors.

Still another object of this invention is to provide a semiconductor memory device using the above-mentioned decoder.

These and other objects and many of the attendant advantages of the invention will be readily appreciated as the same becomes better understood by reference to the following detailed description when considered in connection with the accompanying drawing.

DESCRIPTION OF THE PREFERRED EMBODIMENTS

A decoder is configured based on the foregoing first or second circuit arrangement without using series-gate circuits, and it can operate on a low supply voltage by virtue of the following reason.

In the first circuit arrangement, only the first switch is connected in series between the first and second load elements and the current source, and the second switch is connected in parallel to the first switch. Accordingly, a voltage drop across one switch can be eliminated from the case of the conventional circuit arrangement in which a serial connection of the first and second switches is placed between the load elements and the current source, allowing the supply voltage to be lowered by the amount of this voltage drop.

In the second circuit arrangement, the first (or second) bipolar transistor (generically Q1) and third bipolar transistor (Q3), with their emitters being connected together, can operate in non-saturation mode at an emitter voltage lower than $-V_{OUT}-V_{BE}$. Namely, the emitter voltage of the transistor Q3 can be lowered by the amount of $V_{BE}$ (around 0.8 volt in general) from the emitter voltage $-V_{OUT}-2 \times V_{BE}$ of the third bipolar transistor Q3 of the conventional decoder shown in FIG. 3. Consequently, the inventive decoder can have its supply voltage $|V_{EE}|$ lowered from the conventional $V_{OUT}+2 \times V_{Be}+V1$ to $V_{OUT}+V_{BE}+V1$.

The above discussed concept will now be explained in more detail. For the inventive decoder having an output voltage swing of $V_{OUT}$ volts, the first (or second) bipolar transistor (generically Q1) has a collector voltage of 0 volt for the high output level or $-V_{OUT}$ volts for the low output level. In order for the transistor Q1 to operate in non-saturation mode, the base voltage must always be lower than the collector voltage, and thus it must be lower than $-V_{OUT}$. Accordingly, the emitter voltage of the Q1 must be lower than $-V_{OUT}-V_{BE}$.

Similarly, in order for the transistor Q3 to operate in non-saturation mode, the base voltage must always be lower than the collector voltage, and thus it must be lower than the above-mentioned constant voltage (this voltage is assumed to be 0 volt). Accordingly, the emitter voltage of the Q3 must be lower than $-V_{BE}$. Since the emitters of the Q1 and Q3 are connected together, their common emitter voltage is set lower than $-V_{OUT}-V_{BE}$.

For the current source I1 having an operating voltage of V1, the supply voltage $V_{EE}$ must be lower than $-V_{OUT}-V_{BE}-V1$, or in other words, the supply voltage $|V_{EE}|$ cannot be smaller than $V_{OUT}+V_{BE}+V1$.

Figure 3:
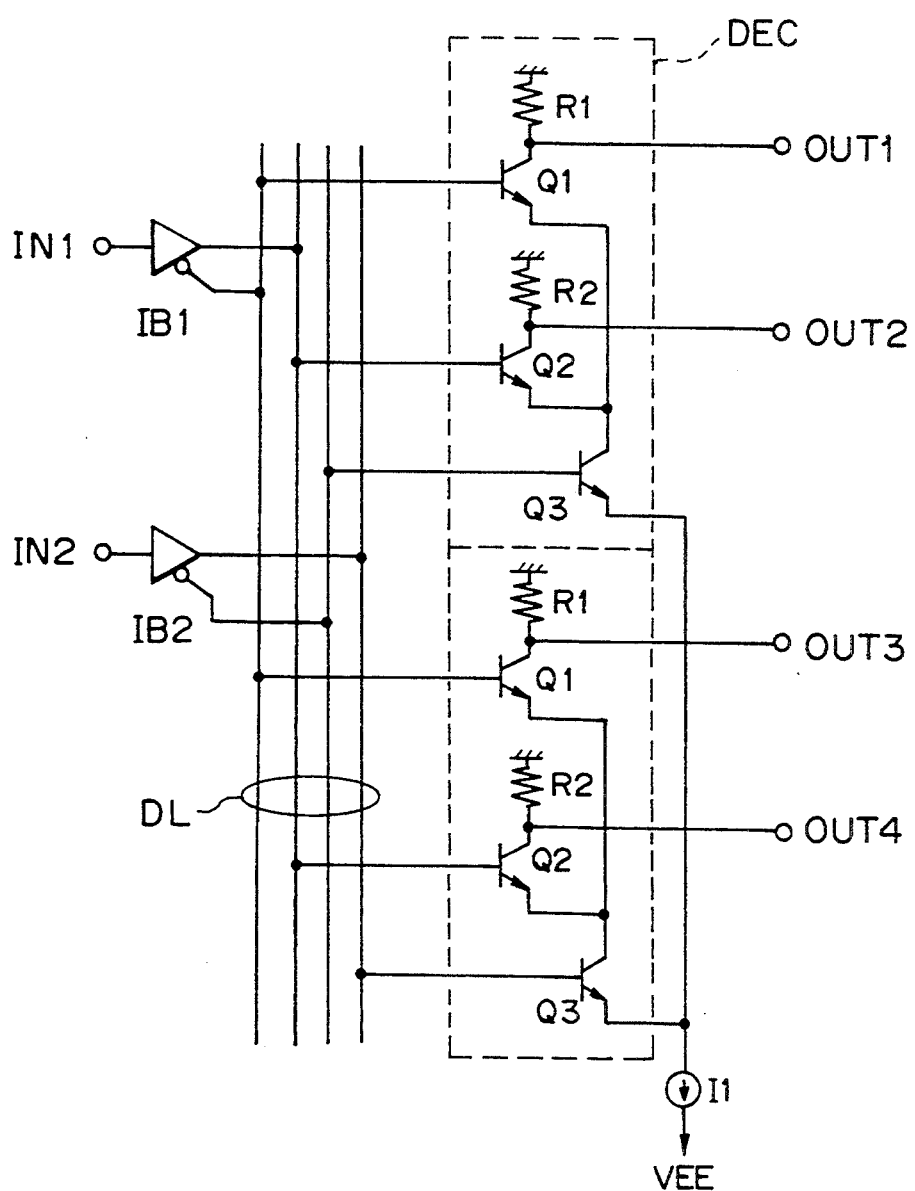
FIG. 3 is a schematic diagram showing the a decoder developed by the present inventors in the course of their research regarding the present invention.

Attention should be paid to the fact that in contrast to the conventional decoder studied by the inventors shown in FIG. 3 that cannot have a supply voltage $|V_{EE}|$ smaller than $V_{OUT}+2 \times V_{BE}+V1$, the inventive decoder can have its supply voltage lowered down to $V_{OUT}+V_{BE}+V1$. Namely, the supply voltage can be lowered by the amount of $V_{BE}$ (it is generally around 0.8 volt).

Next, specific embodiments this invention will be explained in detail.

Figure 1:
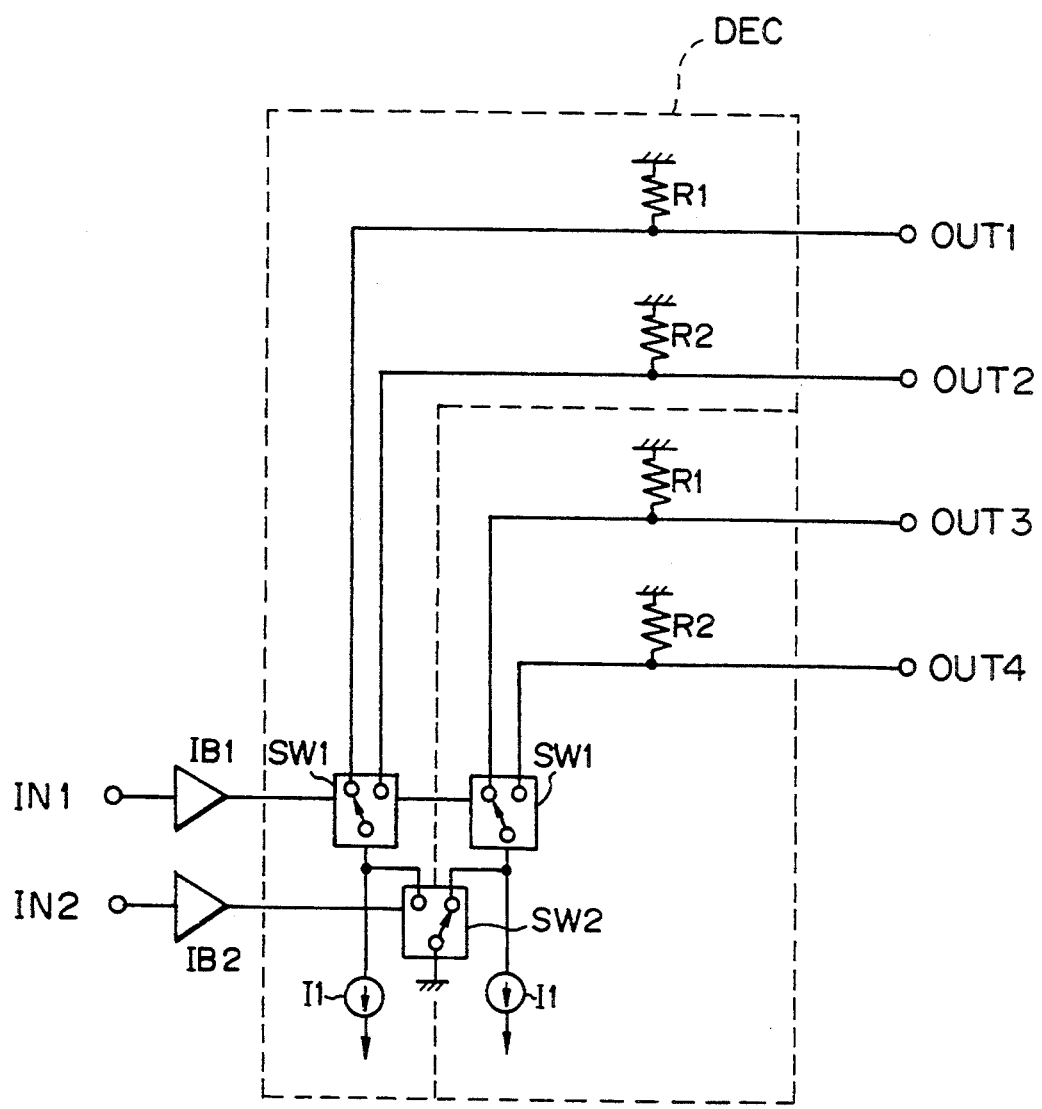
FIG. 1 is a schematic diagram showing the decoder of this invention.

FIG. 1 shows the basic circuit arrangement of the inventive decoder. In the figure, symbols IN1 and IN2 denote inputs, OUT1 through OUT4 are outputs, and IB1 and IB2 are input buffers. The inventive decoder indicated by DEC consists of a plurality of (two as an example) circuit blocks each including a first load element R1, a second load element R2, a current source I1, a first switch SW1 which conducts the current of the current source I1 selectively to the first or second load element depending on a first logic signal produced from a non-inverted input signal, and a second switch SW2 which inhibits the conduction of the current of the current source to the first or second load element regardless of the first logic signal, but depending on a second logic signal produced from another non-inverted input signal, with the output signals OUT1 and OUT2 (OUT3 and OUT4) of each circuit block being led out from the node of the first load element R1 and the first switch SW1 and from the node of the second load element R2 and the first switch SW1.

It should be noted that the two switches (SW1 and SW2) are not connected in series in each circuit block. Namely, the decoder can be configured without using series-gate circuits each formed of a serially connected bipolar transistors, and it can thus have a lowered supply voltage, as mentioned previously. Consequently, a bipolar memory or BiCMOS memory using this decoder can operate on the lower supply voltage.

Figure 2A:
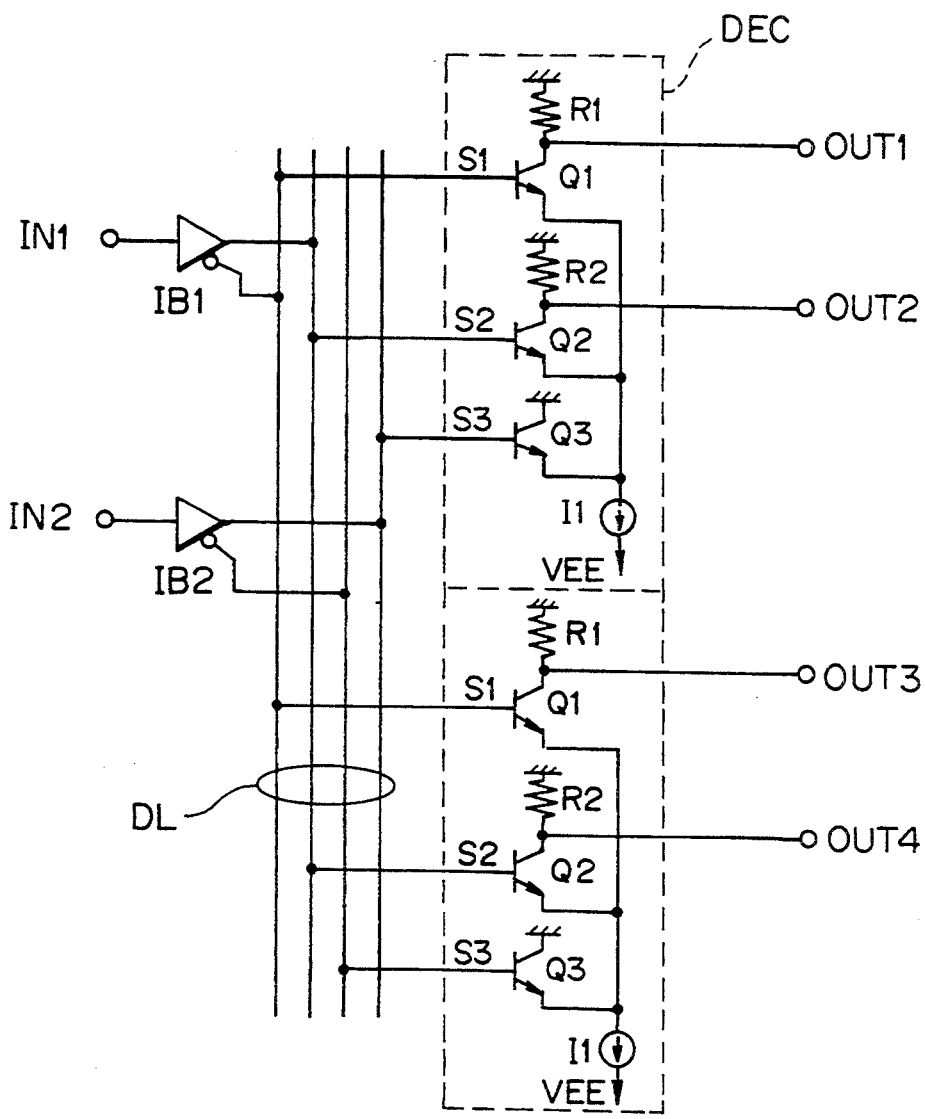
FIG. 2A is a schematic diagram of the decoder based on a first embodiment of this invention.

FIG. 2A shows a decoder based on the first embodiment of this invention. In the figure, symbols IN1 and IN2 denote inputs, OUT1 through OUT4 are outputs, and IB1 and IB2 are input buffers. The decoder DEC consists of a plurality of (two in this embodiment) circuit blocks each including a first bipolar transistor Q1 having its collector connected to a first load element R1 and its base supplied with an inverted input signal IN1, a second bipolar transistor Q2 having its collector connected to a second load element R2, its base supplied with a non-inverted input signal IN1 and its emitter connected to the emitter of the first bipolar transistor Q1, a third bipolar transistor Q3 having its collector supplied with a constant supply voltage of 0 volt, its base supplied with a non-inverted or inverted input signal IN2 and its emitter connected to the emitter of the first bipolar transistor Q1, and a current source I1 connected commonly to the emitters of the first, second and third bipolar transistors Q1–Q3, with the output signals OUT1–OUT4 being led out from the collectors of the first and second bipolar transistors in both circuit blocks.

Figure 2B:
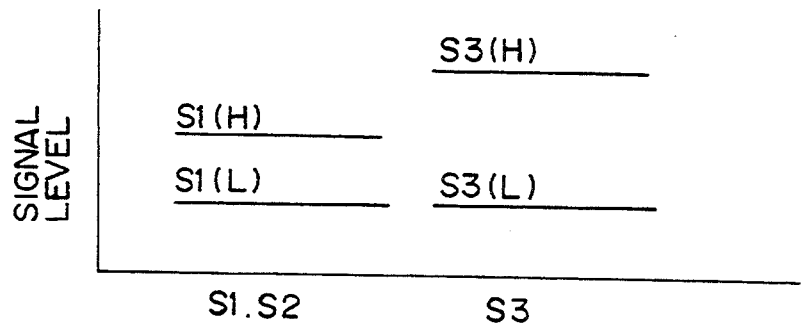
FIG. 2B is a diagram showing signal levels at various portions of the decoder shown in FIG. 2A.

FIG. 2B shows the signal levels of the base input signals S1 and S2 of the transistors Q1 and Q2 and the base input signal S3 of the transistor Q3 in the circuit. It should be noted that the signal S3 has its high level (H) set higher than the high level (H) of the signals S1 and S2 so that the input-output relation of the circuit matches the truth table of Table 1 for the circuit of FIG. 3. Namely; the circuit of FIG. 2A is an L decoder in which one of the outputs OUT1–OUT4 becomes low (L) in response to a certain combination of the inputs IN1 and IN2.

The decoder of this embodiment is different from the one shown in FIG. 3 in that the bipolar transistors Q1 (or Q2) and Q3 are not connected in series and do not form a series-gate circuit. Consequently, the supply voltage can be lowered by the amount of $V_{BE}$ (around 0.8 volt in general) from that of the decoder shown in FIG. 3, and a bipolar memory or BiCMOS memory using this decoder can be designed to operate on the lower supply voltage.

Figure 4A:
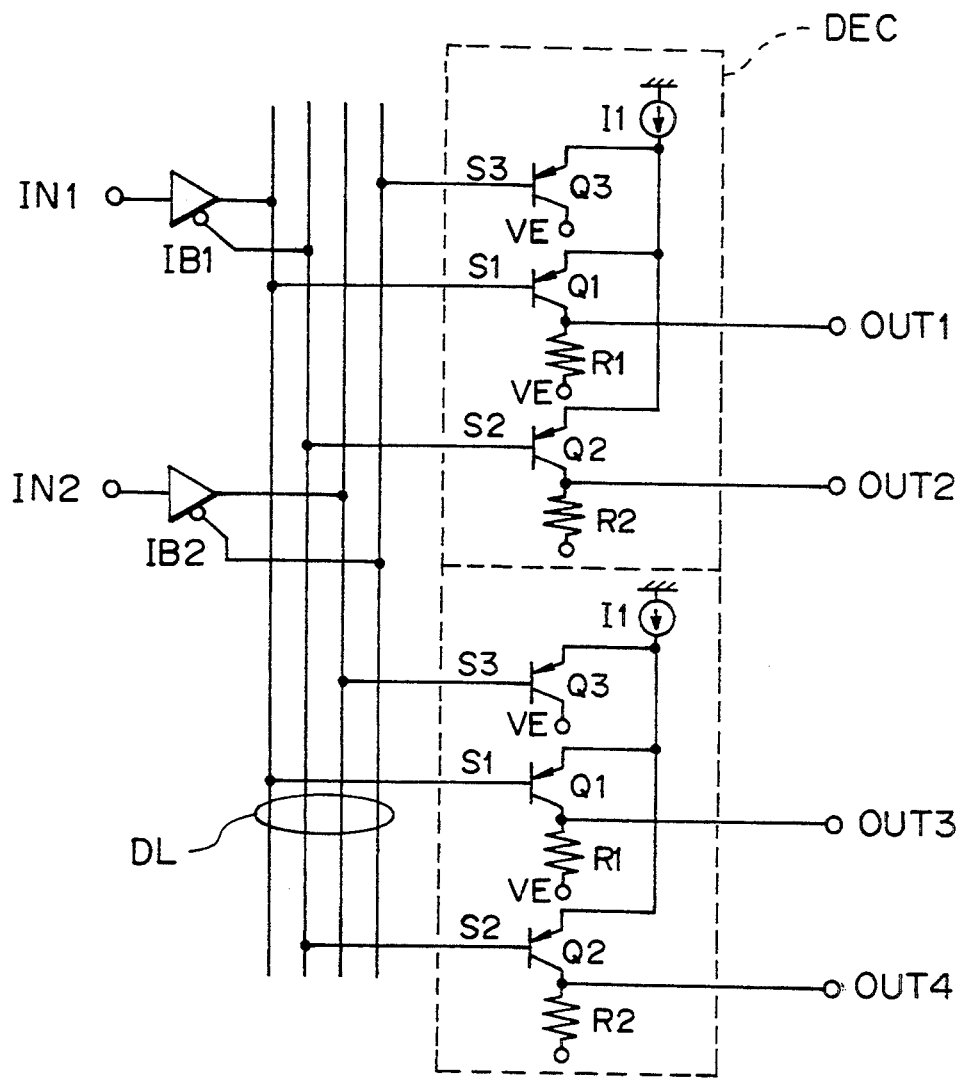
FIG. 4A is a schematic diagram of the decoder based on a second embodiment of this invention.

FIG. 4A shows a decoder based on the second embodiment of this invention. In the figure, symbols IN1 and IN2 denote inputs, OUT1 through OUT4 are outputs, and IB1 and IB2 are input buffers.

The decoder DEC has a plurality of (two in this embodiment) circuit blocks each including a first bipolar transistor Q1 having its collector connected to a first load element R1 and its base supplied with a non-inverted input signal IN1, a second bipolar transistor Q2 having its collector connected to a second load element R2, its base supplied with an inverted input signal IN1 and its emitter connected to the emitter of the first bipolar transistor Q1, a third bipolar transistor Q3 having its collector supplied with a constant supply voltage $V_E$, its base supplied with a non-inverted or inverted input signal IN2 and its emitter connected to the emitter of the first bipolar transistor Q1, and a current source I1 connected commonly to the emitters of the first, second and third bipolar transistors Q1–Q3, with the output signals OUT1–OUT4 being led out from the collectors of the first and second bipolar transistors in both circuit blocks.

Figure 4B:
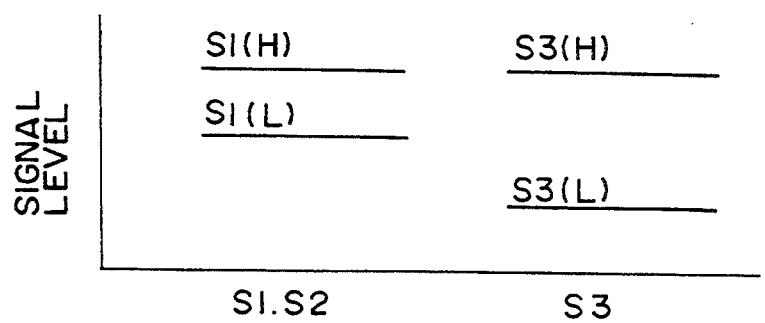
FIG. 4B is a diagram showing signal levels at various portions of the decoder shown in FIG. 4A.

FIG. 4B shows the signal levels of the base input signals S1 and S2 of the transistors Q1 and Q2 and the base input signal S3 of the transistor Q3 in the circuit of FIG. 4A. It should be noted that the signal S3 has its low level (L) set lower than the low level (L) of the signals S1 and S2.

The following Table 2 is a truth table between the inputs IN1 and IN2 and the outputs OUT1–OUT4 of the circuit.

TABLE 2

| IN1 | IN2 | OUT1 | OUT2 | OUT3 | OUT4 |
|-----|-----|------|------|------|------|
| L | L | H | L | L | L |
| H | L | L | H | L | L |
| L | H | L | L | H | L |
| H | H | L | L | L | H |

The decoder shown in FIG. 4A has one of the outputs OUT1–OUT4 becoming a high (H) level in response to a certain combination of the inputs IN1 and IN2, and this kind of decoder will be called an "H decoder".

The decoder of this embodiment is different from the one shown in FIG. 3 in that the bipolar transistors Q1 (or Q2) and Q3 are not connected in series and do not form a series-gate circuit. Consequently, the supply voltage can be lowered by the amount of $V_{BE}$ (around 0.8 volt in general) from that of the decoder shown in FIG. 3, and a bipolar memory or BiCMOS memory using this decoder can be designed to operate on the lower supply voltage.

Figure 5:
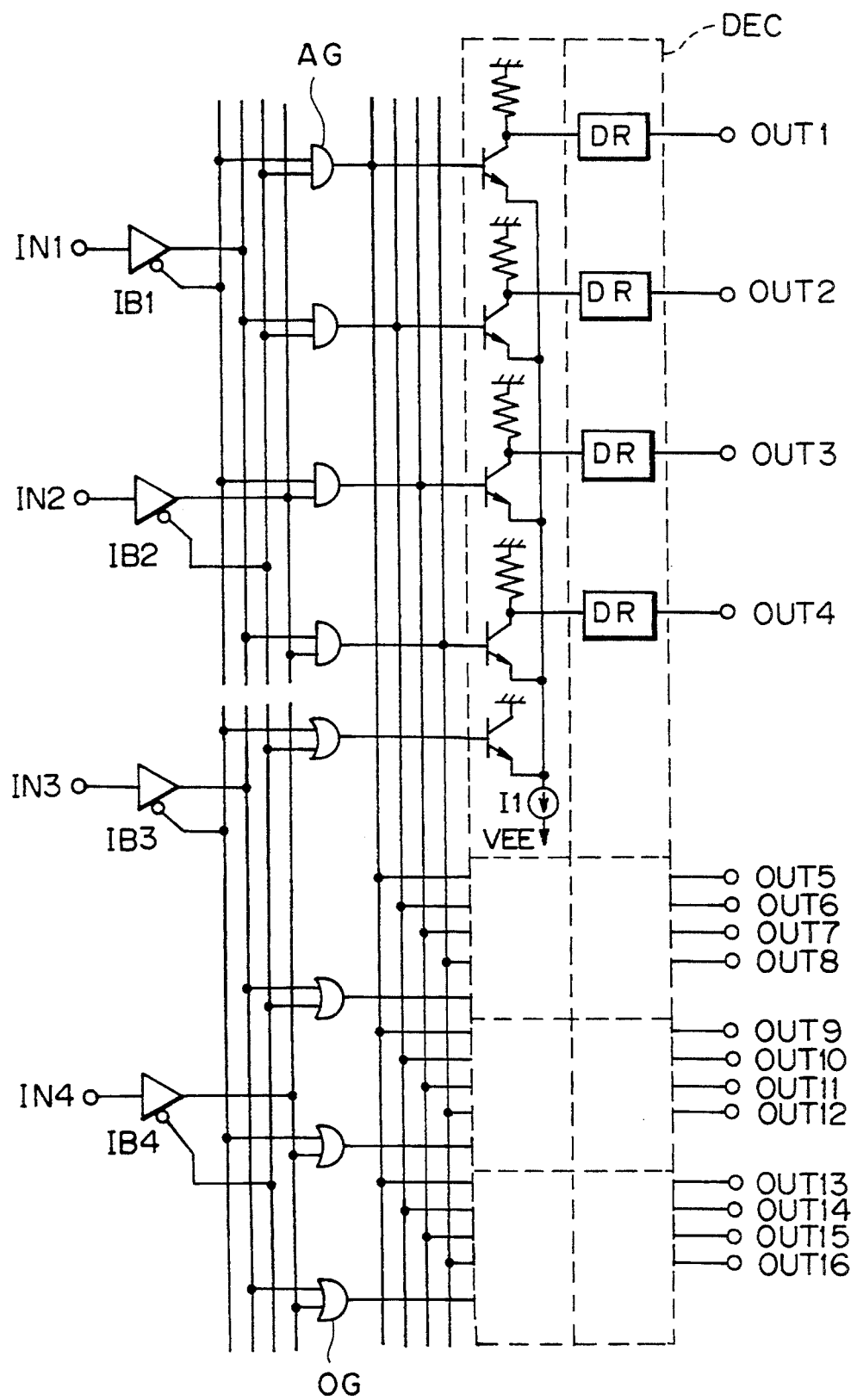
FIG. 5 is a schematic diagram of the decoder based on a third embodiment of this invention.

FIG. 5 shows a decoder based on the third embodiment of this invention. In the figure, symbol DEC denotes the decoder, IB1 and IB2 are input buffers, IN1 through IN4 are inputs, OUT1 through OUT16 are outputs, AG are AND gates which take logical AND between input signals, and OG are logical OR gates which take logical OR between input signals. Each AND gate circuit may be replaced with a pair of pnp bipolar transistors, with their emitters being connected together to implement the wired-AND logic and each OR gate circuit may be replaced with a pair of npn bipolar transistors, with their emitters being connected together to implement the wired-OR logic, and the degree of circuit integration can be enhanced. The decoder DEC incorporates driver circuits DR for the output stage thereby to have an increased drivability.

The following Table 3 is a truth table between the inputs IN1–IN4 and the outputs OUT1–OUT16 of the circuit.

TABLE 3

| IN1 | IN2 | IN3 | IN4 | OUT1 | OUT2 | OUT3 | OUT4 | ... | OUT16 |
|-----|-----|-----|-----|------|------|------|------|-----|-------|
| L | L | L | L | L | H | H | H | ... | H |
| H | L | L | L | H | L | H | H | ... | H |
| L | H | L | L | H | H | L | H | ... | H |
| H | H | L | L | H | H | H | L | ... | H |
| . | . | . | . | . | . | . | . | ... | . |
| . | . | . | . | . | . | . | . | ... | . |
| . | . | . | . | . | . | . | . | ... | . |
| H | H | H | H | H | H | H | H | ... | L |

In the decoder of FIG. 5, the output drivers DR are of a non-inverting type for the input-output relation, and in the case of inverting output drivers, the decoder has inverted outputs OUT1–OUT16 naturally as opposed to those shown in Table 3. Accordingly, the decoder of FIG. 5 having non-inverting output drivers DR is an L decoder that produces one low output among the outputs OUT1–OUT16 for a certain combination of inputs IN1–IN4, and it is an H decoder by having inverting output drivers DR.

The decoder of this embodiment does not use series-gate circuits. Consequently, the supply voltage of the decoder can be lowered, and a bipolar memory or BiCMOS memory using this decoder can be designed to operate on the lower supply voltage.

Figure 6:
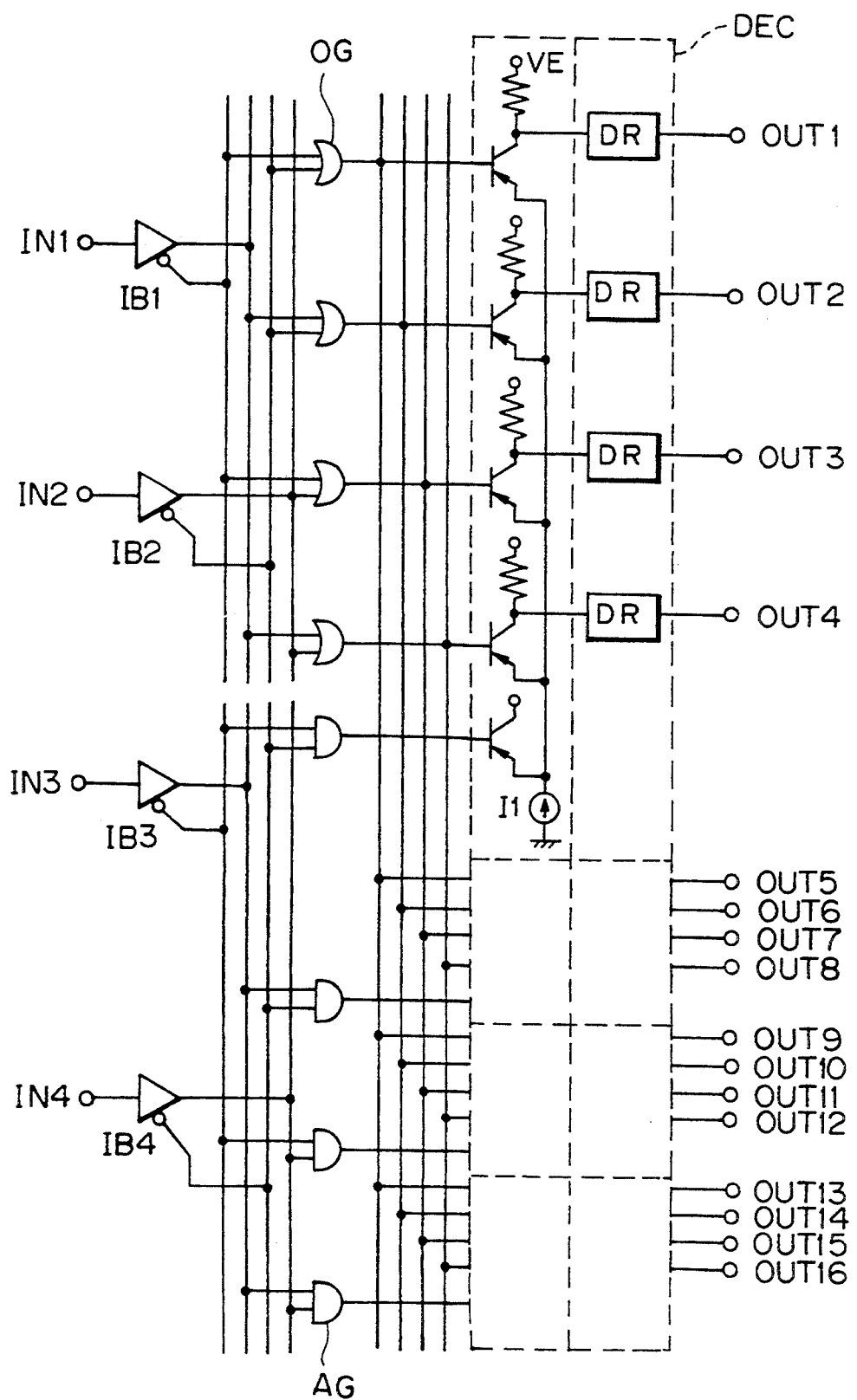
FIG. 6 is a schematic diagram of the decoder based on a fourth embodiment of this invention.

FIG. 6 shows decoder based on the fourth embodiment of this invention. In the figure, symbol DEC denotes the decoder, IB1 through IB4 are input buffers, IN1 through IN4 are inputs, OUT1 through OUT16 are outputs, AG are AND gates which take logical AND between input signals, and OG are logical OR gates which take logical OR between input signals. Each AND gate circuit may be replaced with a pair of pnp bipolar transistors, with their emitters being connected together to implement a wired-AND logic and each OR gate circuit may be replaced with a pair of npn bipolar transistors, with their emitters being connected together to implement a wired-OR logic, and the degree of circuit integration can be enhanced. The decoder DEC incorporates output drivers DR for the output stage thereby having an increased fan-out ability.

The following Table 4 is a truth table between the inputs IN1–IN4 and the outputs OUT1–OUT16 of the circuit.

TABLE 4

| IN1 | IN2 | IN3 | IN4 | OUT1 | OUT2 | OUT3 | OUT4 | ... | OUT16 |
|-----|-----|-----|-----|------|------|------|------|-----|-------|
| L | L | L | L | H | L | L | L | ... | L |
| H | L | L | L | L | H | L | L | ... | L |
| L | H | L | L | L | L | H | L | ... | L |
| H | H | L | L | L | L | L | H | ... | L |
| . | . | . | . | . | . | . | . | ... | . |
| . | . | . | . | . | . | . | . | ... | . |
| . | . | . | . | . | . | . | . | ... | . |
| H | H | H | H | L | L | L | L | ... | H |

In the decoder of this embodiment, the output drivers DR are of a non-inverting type, and in the case of inverting output drivers, the decoder has inverted outputs OUT1–OUT16 naturally as opposed to those shown in Table 4. Accordingly, the decoder of FIG. 6 having non-inverting output drivers DR is an H decoder that produces one high output among the outputs OUT1–OUT16 for a certain combination of inputs IN1–IN4, and it is an L decoder by having inverting output drivers DR.

The decoder of this embodiment does not use series-gate circuits. Consequently, the supply voltage of the decoder can be lowered, and a bipolar memory or BiCMOS memory using this decoder can be designed to operate on the lower supply voltage.

Figure 7:
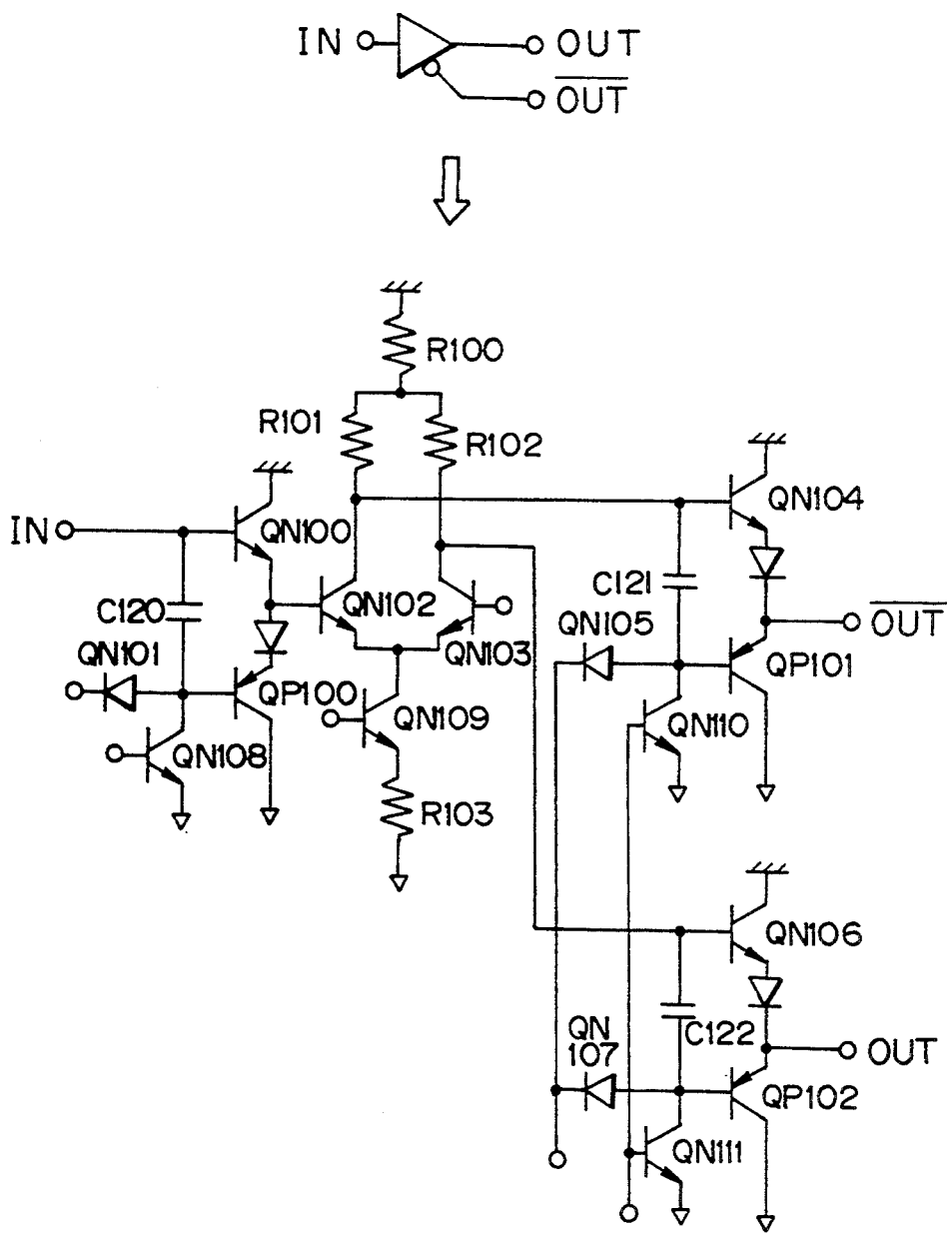
FIG. 7 is a schematic diagram of the input buffer circuit.

FIG. 7 shows an example of a circuit arrangement of the input buffers IB used in the decoders shown in FIG. 1, FIG. 2 and FIG. 4–FIG. 6 as well as the circuit arrangement the decoders of FIG. 21 and FIG. 22, which will be explained later. In the figure, symbol IN denotes the input of the input buffer, and OUT and/OUT are the outputs of the input buffer. The input buffer is configured as a complementary emitter follower circuit including npn bipolar transistors QN100, QN104 and QN106 and pnp bipolar transistors QP100, QP101 and QP102. Since virtually no d.c. currents flow in the emitter follower circuits, the power consumption of the input buffer can be reduced.

Figure 8:
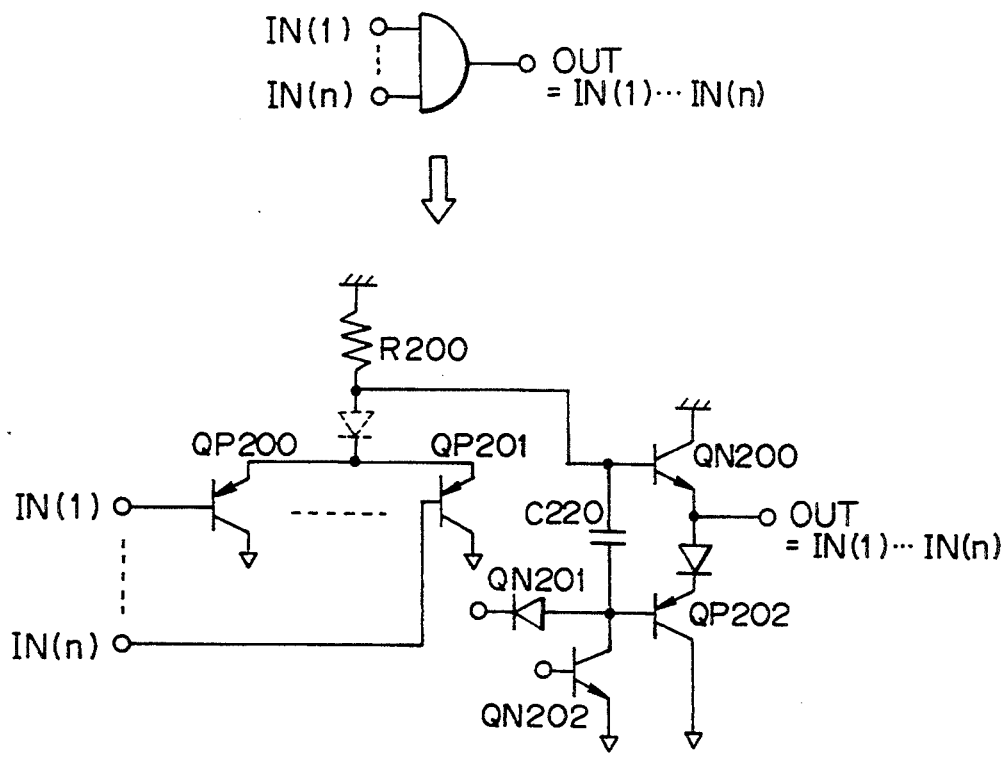
FIG. 8 is a schematic diagram of the AND gate circuit.

FIG. 8 shows an example of a circuit arrangement of the AND gate AG used in the decoders shown in FIG. 5 and FIG. 6 and the decoder of FIG. 21, which will be explained later. In the figure, symbols IN(1) through IN(n) denote inputs of the AND gate, and OUT is the output of the AND gate. The AND gate is configured as a complementary emitter follower circuit including an npn bipolar transistor QN200 and a pnp bipolar transistor QP102. Since virtually no d.c. current flows in the emitter follower circuit, the power consumption of the AND gate can be reduced.

Figure 9:
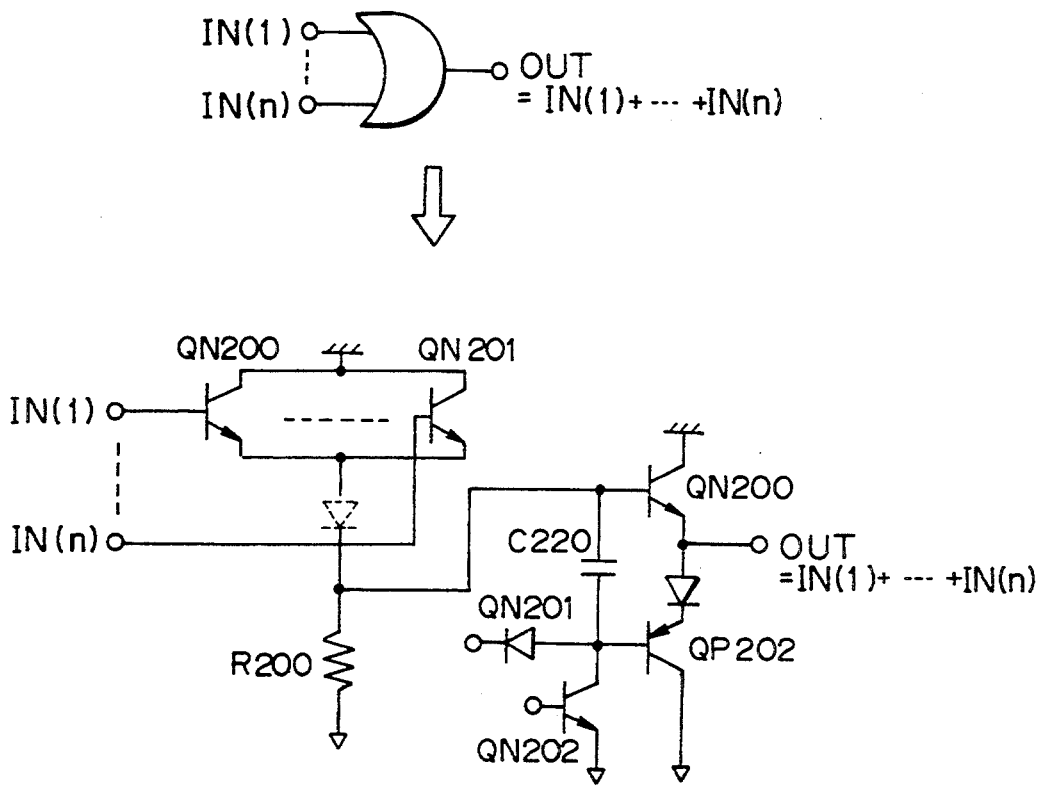
FIG. 9 is a schematic diagram of the OR gate circuit.

FIG. 9 shows an example of a circuit arrangement of the OR gate OG used in the decoders shown in FIG. 5 and FIG. 6 and the decoder of FIG. 22, which will be explained later. In the figure, symbols IN(1) through IN(n) denote inputs of the OR gate, and OUT is the output of the OR gate. The OR gate is configured as a complementary emitter follower circuit including an npn bipolar transistor QN200 and a pnp bipolar transistor QP102. Since virtually no d.c. current flows in the emitter follower circuit, the power consumption of the OR gate can be reduced.

Figure 10:
FIG. 10 is a schematic diagram showing an example of the output driver.
Figure 10:
Figure 10:
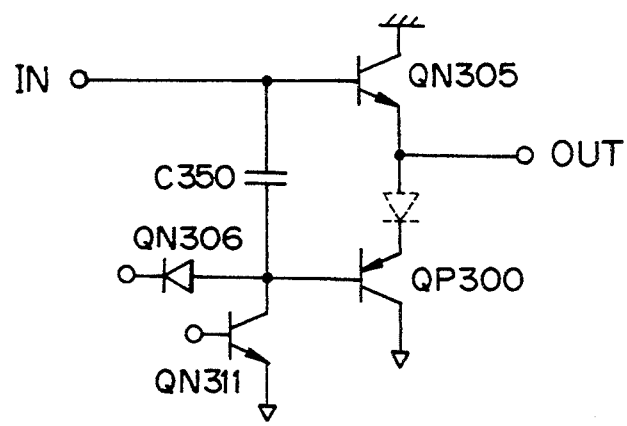

FIG. 10 shows an example of a circuit arrangement of the output driver DR used in the decoders shown in FIG. 5 and FIG. 6 and the decoders of FIG. 21 and FIG. 22, which will be explained later. In the figure, symbols IN and OUT denote the input and output of the driver, respectively. Shown in the figure is a non-inverting output driver. The output driver is configured as a complementary emitter follower circuit including an npn bipolar transistor QN305 and a pnp bipolar transistor QP300. Since virtually no d.c. current flows in the emitter follower circuit, the power consumption of the output driver can be reduced.

Figure 11:
FIG. 11 is a schematic diagram showing another example of the output driver.
Figure 11:
Figure 11:
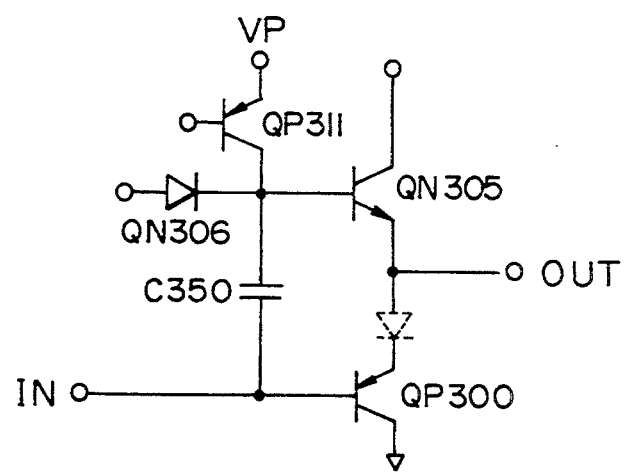

FIG. 11 shows another example of a circuit arrangement of the output driver DR used in the decoders shown in FIG. 5 and FIG. 6 and the decoders of FIG. 21 and FIG. 22, which will be explained later. In the figure, symbols IN and OUT denote the input and output of the driver, respectively. Shown in the figure is a non-inverting output driver providing a higher output level relative to the input, and it is suitable for external circuits which necessitate a high input signal level. The supply voltage VP is preferably set higher than the ground level for the stable operation of the transistor QP311. The output driver is configured as a complementary emitter follower circuit including an npn bipolar transistor QN305 and a pnp bipolar transistor QP300. Since virtually no d.c. current flows in the emitter follower circuit, the power consumption of the output driver can be reduced.

Figure 12:
FIG. 12 is a schematic diagram showing still another example of the output driver.
Figure 12:
Figure 12:
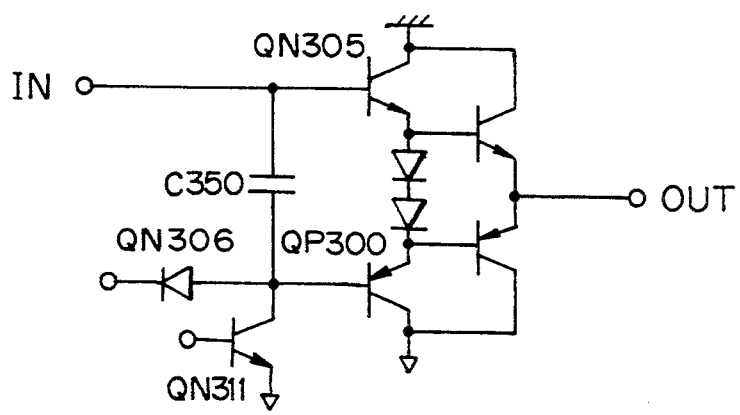

FIG. 12 shows another example of a circuit arrangement of the output driver DR used in the decoders shown in FIG. 5 and FIG. 6 and the decoders of FIG. 21 and FIG. 22, which will be explained later. In the figure, symbols IN and OUT denote the input and output of the driver, respectively. Shown in the figure is a non-inverting output driver. The output driver is configured as a complementary emitter follower circuit including npn and pnp bipolar transistors connected in Darlington pairs. The driver has its power consumption reduced since virtually no d.c. current flows in the emitter follower circuit, and its fan-out ability is increased.

Figure 13:
FIG. 13 is a schematic diagram showing still another example of the output driver.
Figure 13:
Figure 13:
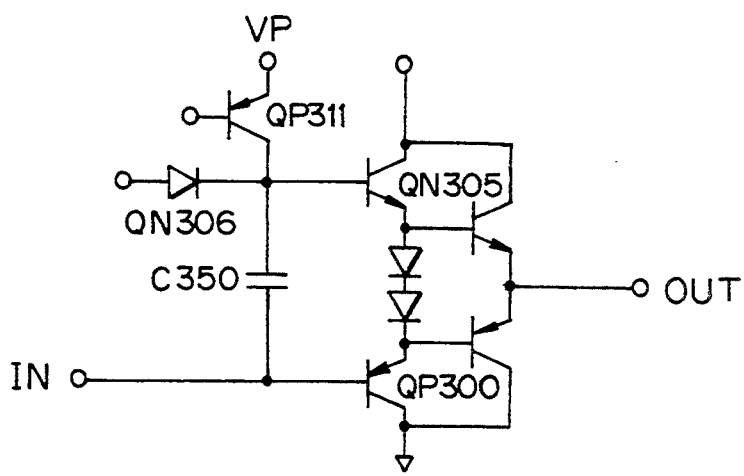

FIG. 13 shows another example of a circuit arrangement of the output driver DR used in the decoders shown in FIG. 5 and FIG. 6 and the decoders of FIG. 21 and FIG. 22, which will be explained later. In the figure, symbols IN and OUT denote the input and output of the driver, respectively. Shown in the figure is a non-inverting output driver providing a higher output level relative to the input, and it is suitable for external circuits which necessitate a high input signal level. The supply voltage VP is preferably set higher than the ground level for the stable operation of the transistor QP311. The output driver is configured as a complementary emitter follower circuit including npn and pnp bipolar transistors connected in Darlington pairs. The driver has its power consumption reduced since virtually no d.c. current flows in the emitter follower circuit, and its fan-out ability is increased.

Figure 14:
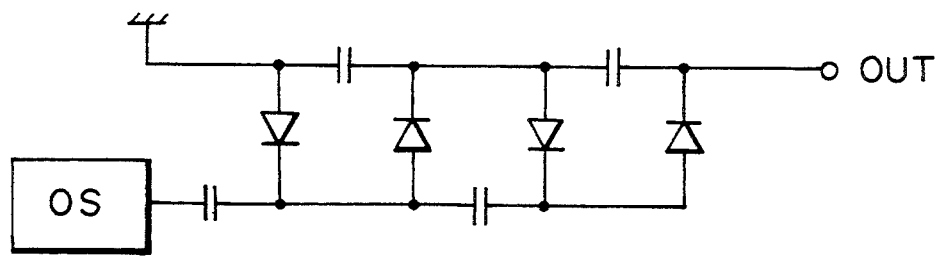
FIG. 14 is a schematic diagram showing an example of the voltage generation circuit.

FIG. 14 shows an example of a circuit arrangement of the voltage generation circuit for producing a voltage VP used for the output drivers shown in FIG. 11 and FIG. 13. Shown is a voltage generator which produces a voltage higher than the ground level. In the figure, symbol OS denotes an oscillator and OUT is the output of the voltage generator. The output voltage $V_{OUT}$ can be expressed in terms of the number of stages n of the diode-capacitor ladder, the amplitude $V_{OS}$ of oscillator output, and the forward voltage drop $V_F$ of the diode as: $V_{OUT} = n \cdot (V_{OS} - 2V_F)/2$, and it is generally higher than the ground level.

Figure 15:
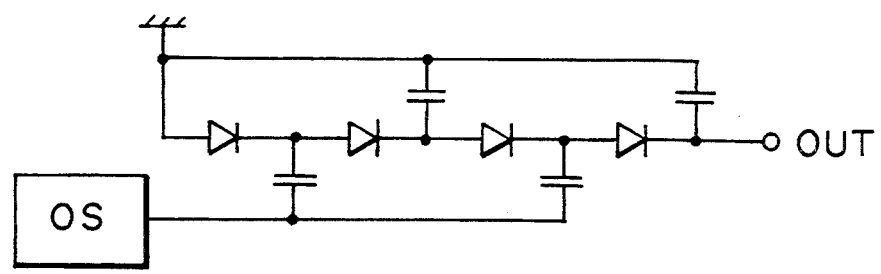
FIG. 15 is a schematic diagram showing another example of the voltage generation circuit.

FIG. 15 shows another example of a circuit arrangement of the voltage generation circuit for producing a voltage VP used for the output drivers shown in FIG. 11 and FIG. 13. Shown is a pull-up circuit which produces a voltage higher than the ground level. In the figure, symbol OS denotes an oscillator and OUT is the output of the voltage generator.

Figure 16:
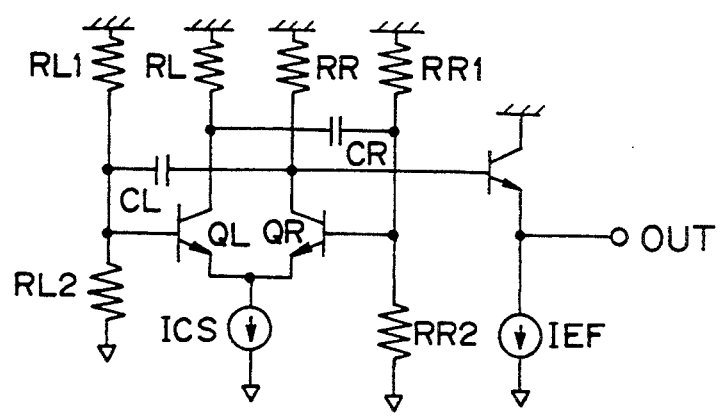
FIG. 16 is a schematic diagram showing an example of the oscillation circuit.

FIG. 16 shows an example of a circuit arrangement of the oscillator OS used in the voltage generation circuits shown in FIG. 14 and FIG. 15. In the figure, symbol OUT denotes the output of the oscillator. The oscillator has its output amplitude determined from the values of load resistors RL and RR, and its oscillation frequency determined from the values of coupling capacitors CL and CR.

Figure 17:
FIG. 17 is a schematic diagram showing still another example of the output driver.
Figure 17:
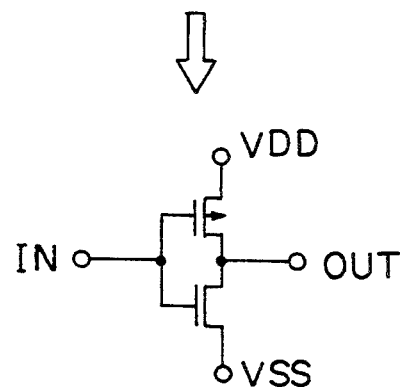

FIG. 17 shows still another example a of circuit arrangement of the output driver DR used in the decoders shown in FIG. 5 and FIG. 6 and the decoders of FIG. 21 and FIG. 22, which will be explained later. In the figure, symbols IN and OUT denote the input and output of the driver, respectively. Shown in the figure is an inverting output driver formed of a CMOS circuit. Since virtually no d.c. current flows in the CMOS driver, the power consumption thereof can be reduced.

Figure 18:
FIG. 18 is a schematic diagram showing still another example of the output driver.
Figure 18:
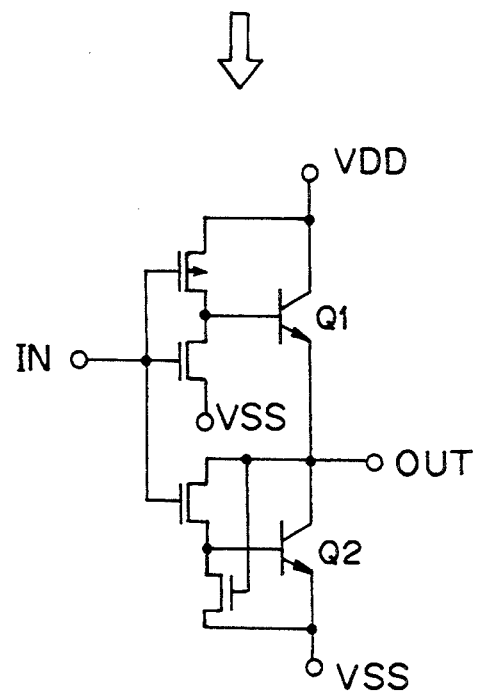

FIG. 18 shows still another example of a circuit arrangement of the output driver DR used in the decoders shown in FIG. 5 and FIG. 6 and the decoders of FIG. 21 and FIG. 22, which will be explained later. In the figure, symbols IN and OUT denote the input and output of the driver, respectively. Shown in the figure is an inverting output driver formed mainly of a BiCMOS circuit. The driver has its power consumption reduced since virtually no d.c. current flows in it, and its fan-out ability is increased.

Figure 19:
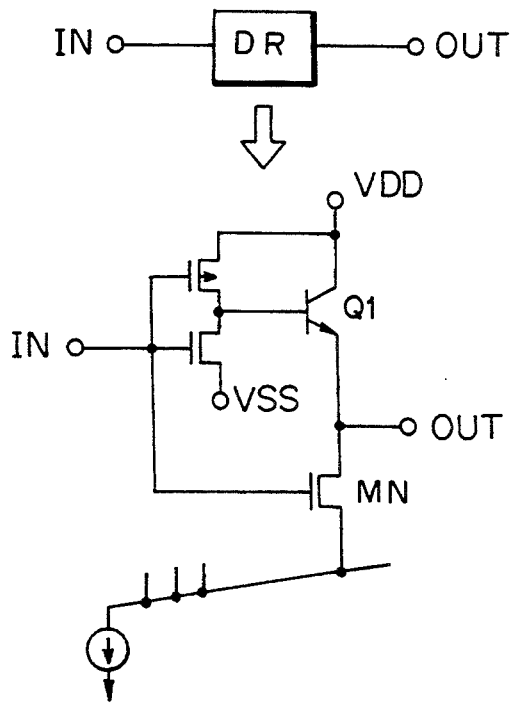
FIG. 19 is a schematic diagram showing still another example of the output driver.

FIG. 19 shows still another example of a circuit arrangement of the output driver DR used in the decoders shown in FIG. 5 and FIG. 6 and the decoders of FIG. 21 and FIG. 22, which will be explained later. In the figure, symbols IN and OUT denote the input and output of the driver, respectively. Shown in the figure is an inverting output driver formed mainly of a BiNMOS circuit, with its NMOS transistor MN being connected to an additional current source so that the output OUT is pulled down fast to the level of $V_{SS} - V_{BE1}$ (where $V_{BE1}$ is the base-to-emitter voltage of the transistor Q1). In the output driver of FIG. 18, the output OUT can be pulled down fast to the level of $V_{SS} + V_{BE2}$ (where $V_{BE2}$ is the base-to-emitter voltage of the transistor Q2), but it does not fall fast from $V_{SS} + V_{BE2}$ to $V_{SS}$ due to the insufficient driving ability of the Q2. Moreover, the output OUT has its voltage swing reduced relative to the input since it cannot fall below $V_{SS}$. In contrast, the output driver of FIG. 19 has the additional current source for the NMOS transistor MN, and therefore the output OUT of a large voltage swing can be pulled down fast to $V_{SS} - V_{BE1}$. Moreover, the low-level output current can be limited by selecting a current value of the current source. Among the multiple output drivers included in a decoder, one driver makes a transition at a time, and therefore a single current source may be used commonly for all drivers thereby to minimize the increased power consumption caused by this current source.

Figure 20:
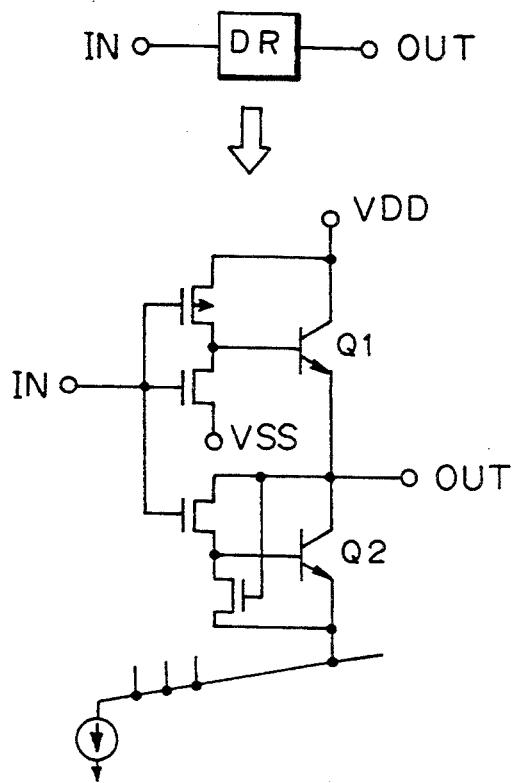
FIG. 20 is a schematic diagram showing still another example of the output driver.

FIG. 20 shows still another example of a circuit arrangement of the output driver DR used in the decoders shown in FIG. 5 and FIG. 6 and the decoders of FIG. 21 and FIG. 22, which will be explained later. In the figure, symbols IN and OUT denote the input and output of the driver, respectively. Shown in the figure is an inverting output driver formed mainly of a BiCMOS circuit, with an bipolar transistor Q2 being connected to an additional current source so that the output OUT of a large voltage swing is pulled down fast to the level of $V_{SS} - V_{BE1}$ (where $V_{BE1}$ is the base-to-emitter voltage of the transistor Q1). Moreover, the low-level output current can be limited by selecting a current value of the current source. Among the multiple output drivers included in a decoder, one driver makes a transition at a time, and therefore a single current source may be used commonly for all drivers thereby to minimize the increased power consumption caused by this current source.

Figure 21:
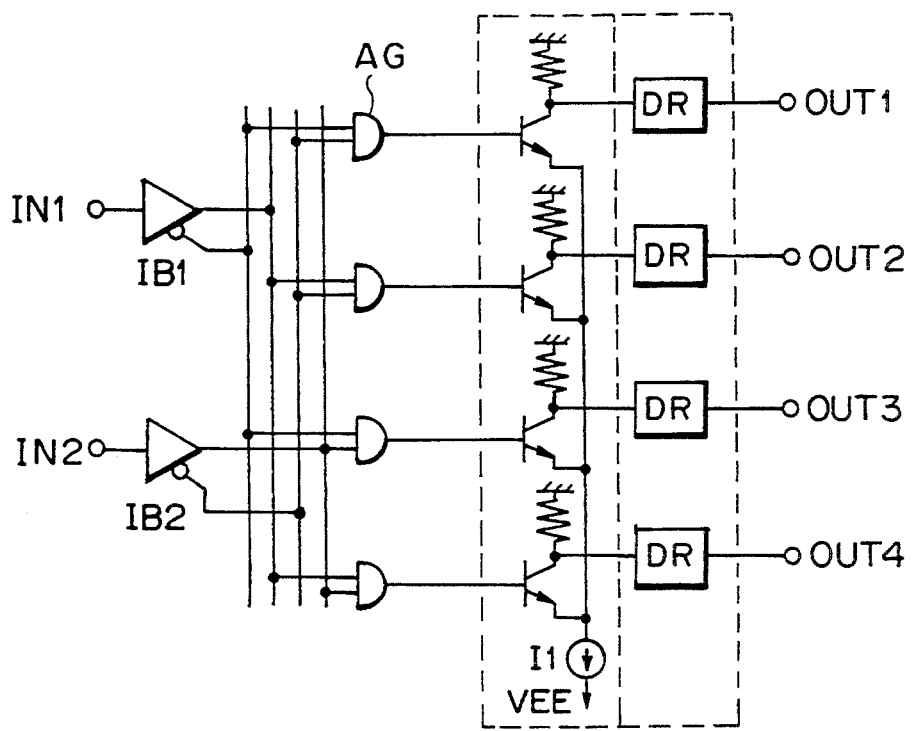
FIG. 21 is a schematic diagram of the decoder based on a fifth embodiment of this invention.

FIG. 21 shows a decoder based on the fifth embodiment of this invention. This decoder is different from the one shown in FIG. 2 in that the former third transistor Q3 is eliminated and twice the number of first and second transistors are used in place of the transistor Q3. It is apparent that the preceding explanation on the circuit arrangement of FIG. 2 is also applied to this decoder and it can operate on a low supply voltage. The reason for the elimination of Q3 is to reduce the number of current sources thereby to achieve a smaller power consumption. However, the operating speed falls due to the increased number of transistors connected to the current source, and therefore the circuit arrangement of FIG. 2 is preferable if faster operation is more important than smaller power consumption.

Figure 22:
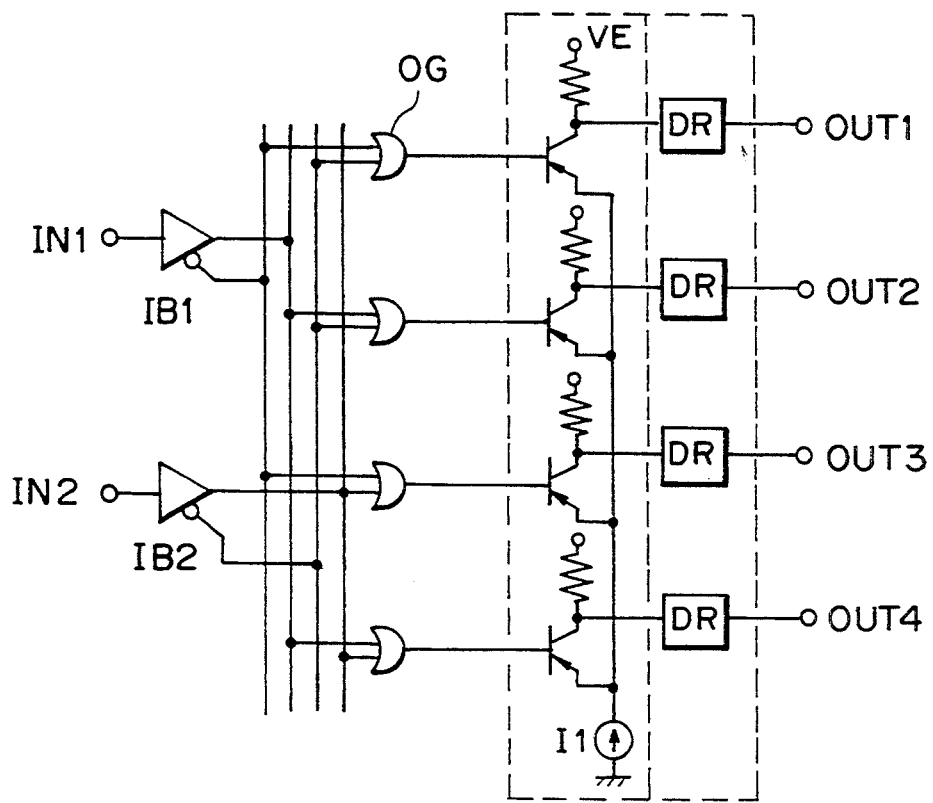
FIG. 22 is a schematic diagram of the decoder based on a sixth embodiment of this invention.

FIG. 22 shows the decoder based on a sixth embodiment of this invention. This decoder is different from the one shown in FIG. 4A in that the former third transistor Q3 is eliminated and twice the number of first and second transistors twice are used in place of the transistor Q3. It is apparent that the preceding explanation on the circuit arrangement of FIG. 4 is also applied to this decoder and it can operate on a low supply voltage. The reason for the elimination of Q3 is to reduce the number of current sources thereby to achieve a smaller power consumption. However, the operating speed falls due to the increased number of transistors connected to the current source, and therefore the circuit arrangement of FIG. 4 is preferable if the faster operation is more important than smaller power consumption.

Figure 23:
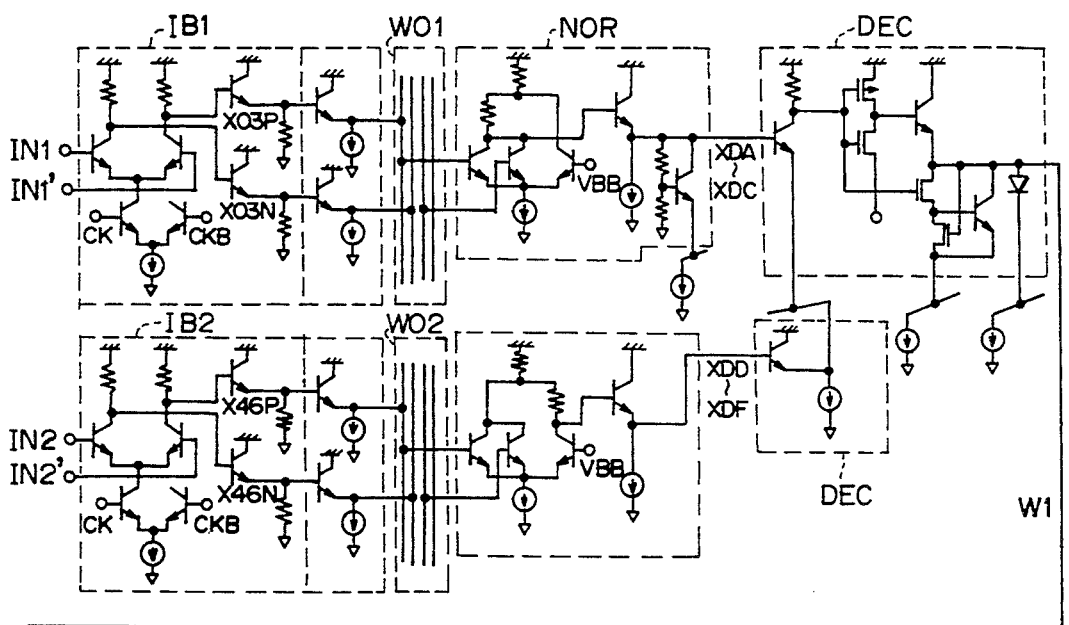
FIG. 23 is a schematic diagram of the BiCMOS memory using the inventive decoder.
Figure 23:
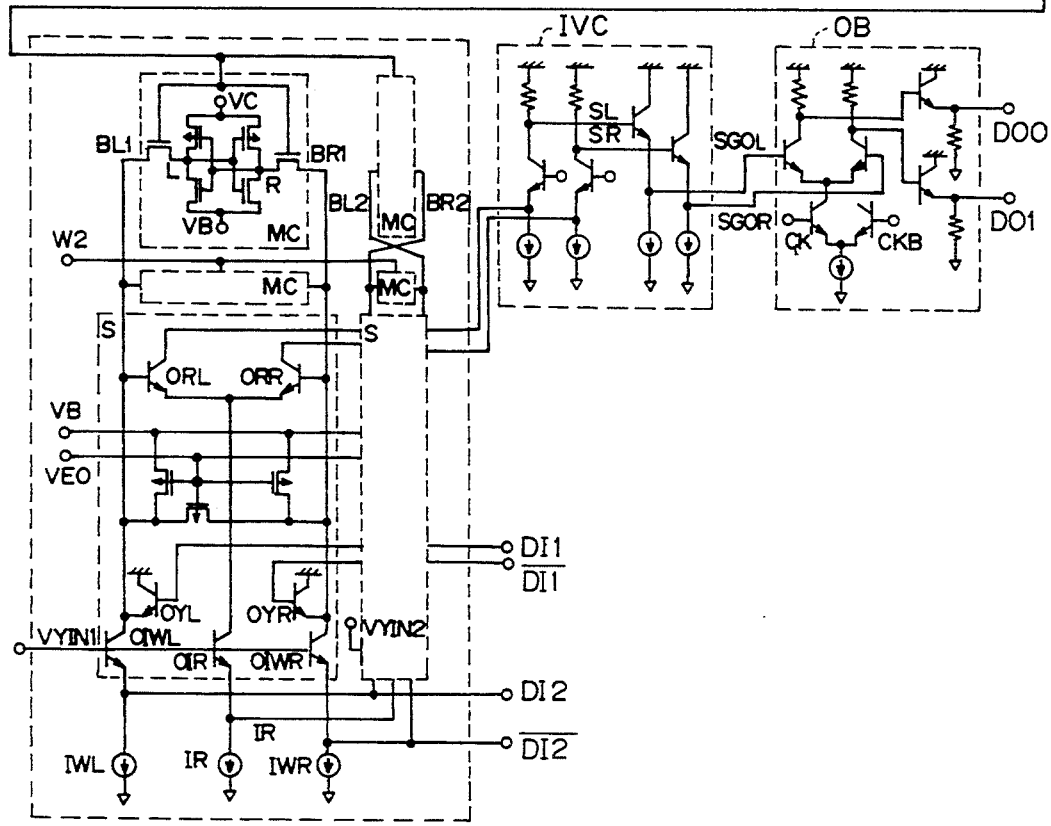

FIG. 23 shows the BiCMOS memory based on an embodiment of this invention including any of the foregoing decoders. In the figure, symbol DEC denotes a decoder, IB1 and IB2 are input buffers, IN1 and IN2 are inputs, WO1 and WO2 are wired-OR gates, and NOR are NOR gates, with the WO1 (WO2) and NOR circuits functioning in unison as a logical AND gate. Indicated by W1 and W2 are word lines, MC are memory cells, S is a sense circuit, IVC is a current-to-voltage conversion circuit, OB is an output buffer, and DO0 and DO1 are outputs.

The decoder included in this embodiment does not use series-gate circuits. Consequently, the supply voltage of the decoder can be lowered, and the BiCMOS memory can operate on a lower supply voltage.

Through the configuration of the word line drive circuit as a complementary emitter follower circuit consisting of npn and pnp bipolar transistors and the memory cells with bipolar transistors in the circuit arrangement of FIG. 23, a bipolar transistor memory can be accomplished.

According to this invention, as described above, a decoder can be configured without using series-gate circuits, and the supply voltage of the decoder can be lowered by the amount of $V_{BE}$ (around 0.8 volt in general). Consequently, a bipolar memory or BiCMOS memory using this decoder can operate with a lower supply voltage than was previously the case.

It is further understood by those skilled in the art that the foregoing description is a preferred embodiment of the disclosed device and that various changes and modifications may be made in the invention without departing from the spirit and scope thereof.

We claim:

1. A decoder comprising:
   a plurality of circuit blocks each including a first bipolar transistor having its collector connected to a first load element and its base supplied with a first logic signal that is a non-inverted or inverted input signal or is produced by a logical AND or logical OR operation for a plurality of input signals; a second bipolar transistor having its collector connected to a second load element, its base supplied with a second logic signal that is a non-inverted or inverted input signal or is produced by a logical AND or logical OR operation for the plurality of input signals and its emitter connected to the emitter of said first bipolar transistor; a third bipolar transistor having its collector supplied with a constant voltage, its base supplied with a third logic signal that is a non-inverted or inverted input signal or is produced by a logical AND or logical OR operation for the plurality of input signals and its emitter connected to the emitters of said first and second bipolar transistors; and a current source connected commonly to the emitters of said first, second and third bipolar transistors; and
   output terminals connected to the collectors of said first and second bipolar transistors in each circuit block, wherein said first, second and third bipolar transistors are of npn type and said third logic signal supplied to the base of said third bipolar transistor has a high level higher than a high level of the logic signals supplied to the bases of said first and second bipolar transistors.

2. A decoder comprising:
   a plurality of circuit blocks each including a first bipolar transistor having its collector connected to a first load element and its base supplied with a first logic signal that is a non-inverted or inverted input signal or is produced by a logical AND or logical OR operation for a plurality of input signals; a second bipolar transistor having its collector connected to a second load element, its base supplied with a second logic signal that is a non-inverted or inverted input signal or is produced by a logical AND or logical OR operation for the plurality of input signals and its emitter connected to the emitter of said first bipolar transistor; a third bipolar transistor having its collector supplied with a constant voltage, its base supplied with a third logic signal that is a non-inverted or inverted input signal or is produced by a logical AND or logical OR operation for the plurality of input signals and its emitter connected to the emitters of said first and second bipolar transistors; and a current source connected commonly to the emitters of said first, second and third bipolar transistors; and
   output terminals connected to the collectors of said first and second bipolar transistors in each circuit block, wherein said first, second and third bipolar transistors are of pnp type and said third logic signal supplied to the base of said third bipolar transistor has a low level lower than a low level of the logic signals supplied to the bases of said first and second bipolar transistor.

3. A decoder according to claim 1, wherein said logical AND or logical operation for a plurality of input signals is implemented by a wired-AND logic circuit in which the emitters of a plurality of pnp bipolar transistors are connected together or a wired-OR logic circuit in which the emitters of a plurality of npn bipolar transistors are connected together.

4. A word line drive circuit of a semiconductor memory comprising:
- a decoder including: a plurality of circuit blocks each comprising a first bipolar transistor having its collector connected to a first load element and its base supplied with a first logic signal that is a non-inverted or inverted input signal or is produced by a logical AND or logical OR operation for a plurality of input signals, a second bipolar transistor having its collector connected to a second load element, its base supplied with a second logic signal that is a non-inverted or inverted input signal or is produced by a logical AND or logical OR operation for the plurality of input signals and its emitter connected to the emitter of said first bipolar transistor, a third bipolar transistor having its collector supplied with a constant voltage, its base supplied with a third logic signal that is a non-inverted or inverted input signal or is produced by a logical AND or logical OR operation for the plurality of input signals and its emitter connected to the emitters of said first and second bipolar transistors, and a current source connected commonly with the emitters of said first, second and third bipolar transistors; and output terminals connected to the collectors of said first and second bipolar transistors in each circuit block;
- a plurality of driver circuits each including a BiCMOS circuit comprising a PMOS transistor having its gate connected to an output terminal of said decoder and its source connected to a first power source, a first NMOS transistor having its drain connected to the drain of said PMOS transistor, its gate connected to the output terminal and its source connected to a second power source, a first npn bipolar transistor having its collector connected to the first power source, its base connected to the drain of said PMOS transistor and its emitter delivering an output signal to a word line of said semiconductor memory, and a second NMOS transistor having its drain connected to the emitter of said first npn bipolar transistor and its gate connected to the output terminal, said driver circuits producing non-inverted or inverted output signals for the signals on said output terminals; and
- a current source connected commonly with the sources of said second NMOS transistors in all driver circuits.

5. A word line drive circuit of a semiconductor memory comprising:
- a decoder including: a plurality of circuit blocks each comprising a first bipolar transistor having its collector connected to a first load element and its base supplied with a first logic signal that is a non-inverted or inverted input signal or is produced by a logical AND or logical OR operation for a plurality of input signals, a second bipolar transistor having its collector connected to a second load element, its base supplied with a second logic signal that is a non-inverted or inverted input signal or is produced by a logical AND or logical OR operation for the plurality of input signals and its emitter connected to the emitter of said first bipolar transistor, a third bipolar transistor having its collector supplied with a constant voltage, its base supplied with a third logic signal that is a non-inverted or inverted input signal or is produced by a logical AND or logical OR operation for the plurality of input signals and its emitter connected to the emitters of said first and second bipolar transistors, and a current source connected commonly with the emitters of said first, second and third bipolar transistors; and output terminals connected to the collectors of said first and second bipolar transistors in each circuit block;
- a plurality of driver circuits each including a BiCMOS circuit comprising a PMOS transistor having its gate connected to an output terminal of said decoder and its source connected to a first power source, a first NMOS transistor having its drain connected to the drain of said PMOS transistor, its gate connected to the output terminal and its source connected to a second power source, a first npn bipolar transistor having its collector connected to the first power source, its base connected to the drain of said PMOS transistor and its emitter delivering an output signal to a word line of said semiconductor memory, a second NMOS transistor having its drain connected to the emitter of said first npn bipolar transistor and its gate connected to the output terminal, and a second npn bipolar transistor having its collector connected to the emitter of said first npn bipolar transistor and its base connected to the source of said second NMOS transistor, said driver circuits producing non-inverted or inverted output signals for the signals on said output terminals; and
- a current source connected commonly with the emitters of said second npn bipolar transistors in all driver circuits.

6. A semiconductor memory comprising:
- a decoder including: a plurality of circuit blocks each comprising a first bipolar transistor having its collector connected to a first load element and its base supplied with a first logic signal that is a non-inverted or inverted input signal or is produced by a logical AND or logical OR operation for a plurality of input signals, a second bipolar transistor having its collector connected to a second load element, its base supplied with a second logic signal that is a non-inverted or inverted input signal or is produced by a logical AND or logical OR operation for the plurality of input signals and its emitter connected to the emitter of said first bipolar transistor, a third bipolar transistor having its collector supplied with a constant voltage, its base supplied with a third logic signal that is a non-inverted or inverted input signal or is produced by a logical AND or logical OR operation for the plurality of input signals and its emitter connected to the emitters of said first and second bipolar transistors, and a current source connected commonly with the emitters of said first, second and third bipolar transistors; and output terminals connected to the collectors of said first and second bipolar transistors in each circuit block;
- wherein said first, second and third bipolar transistors are of npn type and said third logic signal supplied to the base of said third bipolar transistor has a high level higher than a high level of the logic signals supplied to the bases of said first and second bipolar transistors;

a plurality of driver circuits connected to said output terminals and producing non-inverted or inverted output signals for the signals on said output terminals;

word lines connected to an output terminals of said driver circuits;

memory cells connected to said word lines; and a sense circuit which reads data out of said memory cells.

7. A semiconductor memory according to claim 6, wherein said driver circuit is formed of any of a COMS circuit, BiCMOS circuit and BiNMOS circuit and said memory cells are formed of CMOS transistors.

8. A semiconductor memory according to claim 6, wherein said driver circuit is formed of a complementary emitter follower circuit including npn and pnp bipolar transistors and said memory cells are formed of bipolar transistors.

9. A decoder according to claim 2, wherein said logical AND or logical OR operation for a plurality of input signals is implemented by a wired-AND logic circuit in which the emitters of a plurality of pnp bipolar transistors are connected together or a wired-OR logic circuit in which the emitters of a plurality of npn bipolar transistors are connected together.

10. A decoder according to claim 4, wherein said first, second and third bipolar transistors are of npn type and said third logic signal supplied to the base of said third bipolar transistor has a high level higher than a high level of the logic signals supplied to the bases of said first and second bipolar transistors.

11. A decoder according to claim 4, wherein said first, second and third bipolar transistors are of pnp type and said third logic signal supplied to the base of said third bipolar transistor has a low level lower than a low level of the logic signals supplied to the bases of said first and second bipolar transistors.

12. A decoder according to claim 5, wherein said first, second and third bipolar transistors are of npn type and said third logic signal supplied to the base of said third bipolar transistor has a high level higher than a high level of the logic signals supplied to the bases of said first and second bipolar transistors.

13. A decoder according to claim 5, wherein said first, second and third bipolar transistors are of pnp type and said third logic signal supplied to the base of said third bipolar transistor has a low level lower than a low level of the logic signals supplied to the bases of said first and second bipolar transistors.

* * * * *